United States Patent [19]

Coniff

[11] Patent Number: 5,363,552
[45] Date of Patent: Nov. 15, 1994

[54] METHOD OF HEAT SINKING AND MOUNTING A SOLID-STATE DEVICE

[75] Inventor: John B. Coniff, Hoffman Estates, Ill.

[73] Assignee: Eaton Corporation, Cleveland, Ohio

[21] Appl. No.: 96,590

[22] Filed: Jul. 23, 1993

[51] Int. Cl.⁵ .............................................. H05K 3/30
[52] U.S. Cl. ........................................ 29/840; 29/832;
  29/842; 29/874; 361/718; 361/719; 439/487
[58] Field of Search .................. 29/832, 837, 840, 842,
  29/874; 257/726, 727, 718, 719; 361/704, 710,
  714, 715, 717–719; 439/485, 487

[56] References Cited

U.S. PATENT DOCUMENTS

| 4,204,248 | 5/1980 | Proffit et al. | 257/718 |
| 4,388,967 | 6/1983 | Breese | 257/719 |
| 4,707,726 | 11/1987 | Tinder | 361/710 |
| 4,803,545 | 2/1989 | Birkle | 257/726 |

FOREIGN PATENT DOCUMENTS 3214572 9/1991 Japan ................................. 439/487

Primary Examiner—P. W. Echols
Attorney, Agent, or Firm—Roger A. Johnston

[57] ABSTRACT

A unitary strip of thermally and electrically conductive spring material is formed with two rows of spring fingers formed at one end which have frictionally engaged therebetween the bus bar or plate of a solid-state device such as an FET having leads soldered to a printed circuit board. The opposite end of the strip is fastened mechanically to a conductive heat sink block on the circuit board. The strip provides electrical power, support for, and heat sinking of the solid-state device.

10 Claims, 1 Drawing Sheet

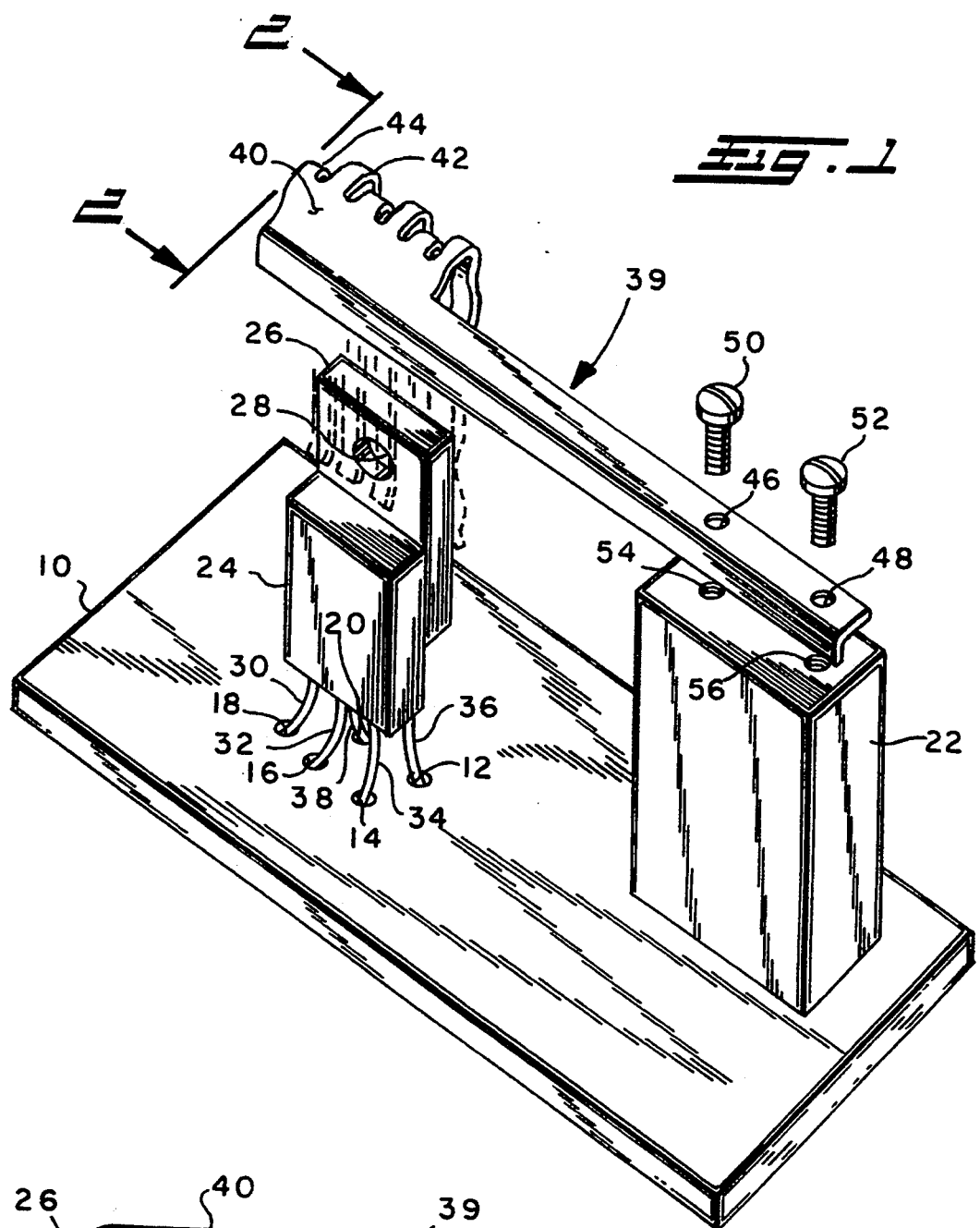
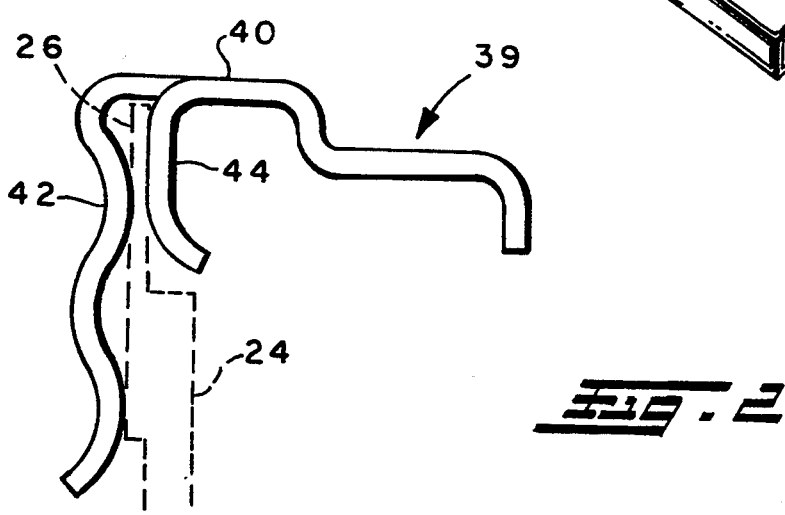

METHOD OF HEAT SINKING AND MOUNTING A SOLID-STATE DEVICE

BACKGROUND OF THE INVENTION

The present invention relates to the assembling of solid-state circuitry device; and particularly to solid-state devices assembled onto a circuit board. Certain circuitry devices such as field effect transistors (FETs) have a metal bus or block extending from the semiconductor material portion for attachment to the power source effecting heat transfer and physically securing the device. Typically, an FET has a metal tab or block provided with an aperture therethrough which is adapted for attachment by a fastener to a conductive mounting structure as, for example, by a clamp and a fastener passing through the aperture in the bus block. In devices employing this type of mounting it is a known technique to first insert the leads of an FET into holes on a printed circuit board and then solder the leads to the underside of the circuit board for electrical connection thereto. The bus bar of the solid-state device is then clamped, typically by a threaded fastener passing through the aperture in the bus bar to a conductive metal mounting bracket. The attachment of the bus bar to the mounting bracket, which must provide for heat transfer and secure electrical and mechanical contact, often results in application of clamping forces to the device which cause movement resulting in rupture of the solder connections of the leads to the printed circuit board.

It has thus been desired to find a way or means of anchoring mechanically and electrically the bus bar of a solid-state device, particularly an FET, when mounting the device to a printed circuit board in such a manner as to prevent breakage of the soldered lead connections to the printed circuit.

SUMMARY OF THE INVENTION

The present invention provides a unitary mounting bracket and heat sink for a solid-state circuit device such as an FET, and provides for frictionally engaging the bus bar of the FET to secure the device in place on a printed circuit board, and to provide electrical power and heat sinking of the device.

The technique of the present invention comprises forming two rows of fingers integrally from a common strip of spring material and frictionally inserting the bus bar of the solid-state device between the rows of fingers and securing the opposite end of the strip to a conductive mounting block on the printed circuit board with suitable mechanical fastening means. The technique of the present invention thus provides thermal conduction and electrical contact from the bus bar of the solid-state device through the strip to the mounting block, yet eliminates the undesired movement of the device by application of heavy clamping forces thereto and prevents rupture of the solder connections to the printed circuit board on the leads of the device.

BRIEF DESCRIPTION OF THE DRAWINGS

FIG. 1 is an axonometric exploded view of the solid-state mounting and heat sinking arrangement of the present invention; and, FIG, 2 is an end view, taken along section-indicating lines 2—2 of FIG. 1.

DETAILED DESCRIPTION

Referring to the drawings, the invention employs a printed circuit board having etched circuitry components (not shown) provided on the underside thereof, as is well known in the art. Board I 0 has a plurality of relatively small apertures 12,14,16,18,20 provided therethrough for connection to the leads of a circuitry component, as will hereinafter be described. The circuit board 10 has mounted thereon a conductive block 22 which is adapted to provide power through connection to circuit means (not shown).

A typical solid-state circuit device such as an FET is denoted by reference numeral 24, having a bus bar or plate 26 with a typically provided mounting aperture 28 formed thereon. Device 24 has a plurality of electrical leads 30,32,34,36,38 extending therefrom, each of which extends through one of the apertures 18 through 20 provided in the printed circuit board 10. It will be understood that each of the leads 30 through 36 is soldered by any of the known techniques to the etched portions of the printed circuit (not shown) on the undersurface of the printed circuit board.

Referring to FIGS. 1 and 2, a unitary strip of electrically conductive spring material having a relatively high coefficient of thermal conductivity as, for example, heat treated or precipitation hardened beryllium copper is indicated generally at 39, and has generally right angle configuration in transverse section along the major portion of its length. The strip 39 has formed at one end thereof a flange portion extending laterally therefrom along one edge, as denoted by reference numeral 40. The flange portion 40 has formed integrally therewith in alternating or staggered arrangement two parallel rows of spring fingers which extend generally at right angles thereby, as denoted by reference numerals 42,44 in FIG. 2.

It will be understood that upon assembly, the bracket 39 is moved downwardly over the bus bar 26 such that the fingers 42,44 frictionally engage the bus bar 26 on opposite sides thereof as it is inserted between the fingers and provides sufficient contact surface therebetween to conduct electrical current and heat therebetween. The end of the strip 39 opposite flange 40 has a pair of apertures 46,48 formed therein through which are received, respectively, fasteners in the form of screws 50,52 which threadedly engage tapped bores 54,56 in block 22 to secure the strip 39 to the mounting block 22 in electrical and heat conducting engagement.

The present invention thus provides a simple low-cost and effective way of heat sinking and electrically connecting to the bus of a solid-state device such as an FET upon attachment of the leads of the device to a printed circuit board. The unitary mounting bracket/strip of the present invention employs spring fingers which frictionally engage the bus plate of the solid state device to provide for electrical current and heat flow therebetween. The attachment strip of the present invention thus eliminates the need for the separate fastener through the bus bar of the solid-state device, and therefore eliminates any clamping forces encountered during installation from breaking the solder connections of the device to the printed circuit board.

Although the invention has been described herein with respect to the illustrated embodiment, it will be understood that the invention is capable of modification and variation, and is limited only by the following claims.

I claim:

1. A method of heat sinking and mounting a solid-state junction device having leads for attachment to a circuit and a bus bar comprising:
   (a) providing a strip having a thickness significantly less than its width and formed of material of relatively high electrical and thermal conductivity;
   (b) forming a first row of spaced fingers extending outwardly from said strip;
   (c) forming a second row of spaced fingers extending outwardly from said strip in generally spaced parallel relationship with said first row;
   (d) inserting and frictionally engaging the bus of said solid-state device between said first and second rows of fingers and making electrical and thermally conductive contact therebetween; and,
   (e) attaching the electrical leads of said device to a circuit and anchoring said strip to said circuit.

2. The method defined in claim 1, wherein said step of forming said second row of fingers includes forming the individual fingers in said second row disposed in alternating arrangement with respect to the fingers in said first row.

3. The method defined in claim 1, wherein said step of anchoring said strip includes providing a mounting block of material having a relatively high electrical and thermal conductivity on said circuit board and attaching said strip to said mounting block.

4. A method of heat sinking and mounting a solid-state junction device having leads for attachment to a circuit and a bus bar comprising:
   (a) attaching said leads to a circuit;
   (b) providing a strip of material of relatively high electrical and thermal conductivity;
   (c) forming at least two fingers extending from said strip and disposed in spaced generally parallel arrangement;
   (d) inserting said bus bar between said fingers and making electrical and thermally conductive contact therebetween and anchoring said strip to said circuit.

5. The method defined in claim 4, wherein said step of forming includes forming said fingers integrally with said strip.

6. The method defined in claim 4 wherein said step of anchoring includes providing a circuit board and securing a mounting block thereto and fastening said strip to said mounting block.

7. The method defined in claim 4, wherein said step of attaching said leads includes providing a printed circuit board and soldering said leads to said circuit board.

8. The method defined in claim 4, wherein said step of anchoring said strip includes providing a printed circuit board with a conductive block thereon and securing said strip to said block with a threaded fastener.

9. The method defined in claim 4, wherein said step of forming includes the step of metal stamping.

10. The method defined in claim 4, wherein said step of forming includes the steps of metal stamping and heat treating.

* * * * *